United States Patent [19]
Shelton et al.

[11] Patent Number: 5,424,544
[45] Date of Patent: Jun. 13, 1995

[54] INTER-PIXEL THERMAL ISOLATION FOR HYBRID THERMAL DETECTORS

[75] Inventors: Gail D. Shelton, Mesquite; James F. Belcher, Plano; Steven N. Frank, McKinney; Charles M. Hanson, Richardson; Edward G. Meissner, Dallas; Robert A. Owen, Rowlett, all of Tex.

[73] Assignee: Texas Instruments Incorporated, Dallas, Tex.

[21] Appl. No.: 235,835

[22] Filed: Apr. 29, 1994

[51] Int. Cl.⁶ .............................................. H04N 5/33
[52] U.S. Cl. ................................. 250/332; 250/338.3
[58] Field of Search ...................... 250/332, 338.9, 349

[56] References Cited

U.S. PATENT DOCUMENTS

| | | | |
|---|---|---|---|
| 3,846,820 | 11/1974 | Lampe et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,205,227 | 5/1980 | Reed | 250/330 |
| 4,275,302 | 6/1981 | Imbert et al. | 250/330 |
| 4,379,232 | 4/1983 | Hopper | 250/332 |
| 4,594,507 | 6/1986 | Elliott et al. | 250/331 |
| 4,705,361 | 11/1987 | Frazier et al. | 350/355 |
| 4,740,700 | 4/1988 | Shaham et al. | 250/332 |
| 4,751,387 | 6/1988 | Robillard | 250/331 |
| 4,994,672 | 2/1991 | Cross et al. | 250/330 |
| 5,010,251 | 4/1991 | Grinberg et al. | 250/332 |
| 5,021,663 | 6/1991 | Hornbeck | 250/349 |
| 5,047,644 | 9/1991 | Meissner et al. | 250/332 |
| 5,051,591 | 9/1991 | Trotta et al. | 250/351 |
| 5,196,703 | 3/1993 | Keenan | 250/332 |
| 5,238,530 | 8/1993 | Douglas et al. | 156/635 |
| 5,264,326 | 11/1993 | Meissner et al. | 430/313 |

FOREIGN PATENT DOCUMENTS

| | | |
|---|---|---|
| 939943 | 1/1974 | Canada . |
| 2111746 | 9/1971 | Germany . |
| 197806 | 6/1976 | Germany . |
| 2251952 | 7/1992 | United Kingdom . |
| WO91/16607 | 10/1991 | WIPO . |

OTHER PUBLICATIONS

R. A. Wood, "HIDAD-A Monolithic, Silicon, Uncooled Infrared Imaging Focal Plane Array," HIDAD, date unknown, pp. 579-581.

*Primary Examiner*—Carolyn E. Fields
*Attorney, Agent, or Firm*—Brian A. Carlson; Richard A. Stoltz; James C. Kesterson

[57] ABSTRACT

A thermal detection system (100, 200) includes a focal plane array (102, 202), a thermal isolation structure (104, 204) and an integrated circuit substrate (106, 206). The focal plane array (102, 202) includes thermal sensors (114, 214) formed from a pyroelectric element (116, 216), such as barium strontium titanate (BST). One side of the pyroelectric element (116, 216) is coupled to a contact pad (110, 210) disposed on the integrated circuit substrate (106, 206) through a mesa strip conductor (112, 212) of the thermal isolation structure (104, 204). The other side of the pyroelectric element (116, 216) is coupled to a common electrode (120, 220). In one embodiment, slots (128) are formed in the common electrode (120) intermediate the thermal sensors (114) to improve inter-pixel thermal isolation. In another embodiment, slots (236) are formed in the optical coating (224) to improve inter-pixel thermal isolation. The common electrode (120, 220) may be formed from a thermally insulating material, such as a silicon monoxide and chromium matrix (cermet) or other metal oxide.

30 Claims, 2 Drawing Sheets

INTER-PIXEL THERMAL ISOLATION FOR HYBRID THERMAL DETECTORS

RELATED APPLICATIONS

This application is related to copending application Ser. No. 08/182,865, entitled *Infrared Detector and Method,* copending application Ser. No. 08/182,268, entitled *Infrared Detector and Method,* and copending application Ser. No. 08/235,068, entitled *Thermal Isolation Structure for Hybrid Thermal Detectors,* all applications of the same assignee.

TECHNICAL FIELD OF THE INVENTION

This invention relates to inter-pixel thermal isolation in a hybrid solid state system, and more particularly to inter-pixel thermal isolation in a thermal (infrared) detector.

BACKGROUND OF THE INVENTION

One common application for thermal sensors is in thermal (infrared) detection devices such as night vision equipment. One class of thermal detection devices includes a focal plane array of infrared detector elements or thermal sensors coupled to an integrated circuit substrate with a corresponding array of contact pads between the focal plane array and the integrated circuit substrate. The thermal sensors define the respective picture elements or pixels of the resulting thermal image.

One type of thermal sensor includes a pyroelectric element formed from a pyroelectric material that changes its electrical polarization and capacitance in response to thermal radiation, such as barium strontium titanate (BST). An infrared absorber and common electrode assembly is disposed on one side of the pyroelectric element and comprises an optical coating disposed over a common electrode. A sensor signal electrode is disposed on the opposite side of each pyroelectric element. The infrared absorber and common electrode assembly typically extends across the surface of the focal plane array and electrically couples each pyroelectric element through the common electrode. Each infrared detector element or thermal sensor is defined, in part, by a portion of the infrared absorber and common electrode assembly and a respective sensor signal electrode, which constitute capacitive plates, and a pyroelectric element, which constitutes a dielectric or insulator disposed between the capacitive plates.

To maximize thermal response and enhance thermal image accuracy, each pyroelectric element of the focal plane array is preferably isolated thermally from adjoining pyroelectric elements so that the sensor signal accurately represents incident infrared radiation associated with each thermal sensor. Thermal isolation between adjoining thermal sensors, known as inter-pixel thermal isolation, improves the accuracy and quality of the resulting thermal image. Several approaches have been used to improve inter-pixel thermal isolation in a focal plane array.

SUMMARY OF THE INVENTION

In accordance with the present invention, the disadvantages and problems associated with thermal coupling between adjoining thermal sensors of a focal plane array have been substantially reduced. The present invention improves inter-pixel thermal isolation by selectively reticulating the common electrode and/or by forming the common electrode out of a thermally insulating material.

In one aspect of the present invention, a hybrid infrared detector includes a focal plane array mounted with a thermal isolation structure on an integrated circuit substrate. Thermal sensors, each having an associated pyroelectric element, provide a sensor signal output representative of thermal radiation incident to the focal plane array. A common electrode may be coupled to the thermal sensors with one or more slots formed intermediate the thermal sensors. The slots are preferably configured so that the common electrode supplies a potential to each thermal sensor. A non-reticulated, continuous optical coating sensitive to infrared radiation is preferably disposed over the common electrode. The thermal isolation structure is preferably disposed between the focal plane array and the integrated circuit substrate. The thermal isolation structure projects from the integrated circuit substrate for mounting the focal plane array and for coupling the focal plane array to the integrated circuit substrate. Contact pads disposed on the integrated circuit substrate receive the sensor signal output from the thermal sensors through the thermal isolation structure.

In accordance with another aspect of the present invention, a method is disclosed for fabricating a thermal detection system having a focal plane array mounted with a thermal isolation structure on an integrated circuit substrate. The focal plane array is preferably formed from thermal sensors that provide a sensor signal output representative of thermal radiation incident to the focal plane array. Each thermal sensor may be formed in part from an associated pyroelectric element. A common electrode formed from thermally insulating material is coupled to a first side of the thermal sensors so that the common electrode provides a potential to the thermal sensors. A non-reticulated, continuous optical coating sensitive to radiation is disposed over the common electrode. The integrated circuit substrate is provided with contact pads for receiving the sensor signal output from the thermal sensors. The thermal isolation structure is formed between the focal plane array and the integrated circuit substrate. The thermal isolation structure is formed in part from mesa-type formations projecting from the integrated circuit substrate adjacent to the contact pads. The thermal sensors are coupled on a second side to the thermal isolation structure to establish a sensor signal flowpath from the thermal sensors to the integrated circuit substrate.

Important technical advantages of the present invention can include forming a plurality of slots in the common electrode of the infrared absorber and common electrode assembly to improve inter-pixel thermal isolation. The thermally isolating slots are disposed intermediate the thermal sensors and configured to maintain an electrical path through the common electrode for supplying a potential to each thermal sensor. By forming these slots, the thermal detector Modulation Transfer Function (MTF) is increased to improve overall thermal detection sensitivity.

Other important technical advantages of the present invention can include forming the common electrode of the infrared absorber and common electrode assembly out of a thermally insulating material to improve inter-pixel thermal isolation. Current thermal detection systems may use an electrically and thermally conductive material, such as nichrome (NiCr), to form the common electrode. The present invention can include using a thermally insulating material, such as a silicon monoxide and chromium matrix (cermet) or other metal oxide, that provides adequate electrical conductivity to deliver a potential to each thermal sensor while substantially improving inter-pixel thermal isolation.

Further important technical advantages of the present invention can include forming the common electrode in an infrared absorber and common electrode assembly from a thicker layer of thermally insulating material to reduce electrical discontinuities in the common electrode and to improve mechanical integrity. Current thermal detectors minimize inter-pixel thermal isolation by reducing the thickness of a metal common electrode, which substantially increases the possibility of introducing electrical discontinuities during the fabrication process. A thicker common electrode formed from thermally insulating material, such as a silicon monoxide and chromium matrix (cermet) or other metal oxide, improves inter-pixel thermal isolation, simplifies the fabrication process, and results in higher mechanical integrity of the hybrid thermal detector.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Figure 1:
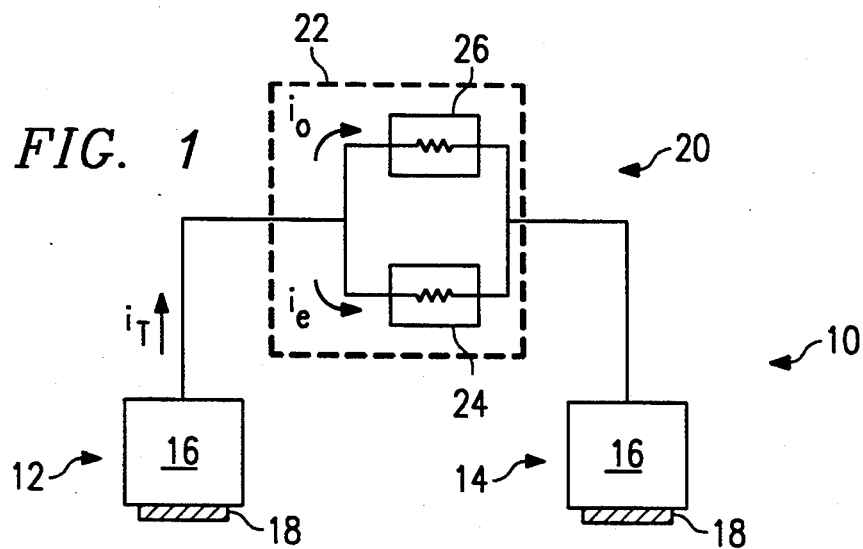
FIG. 1 is a schematic representation of a thermal circuit associated with a thermal detection system showing the thermal conductivity through an infrared absorber and common electrode assembly between a pair of adjoining thermal sensors.
Figure 2:
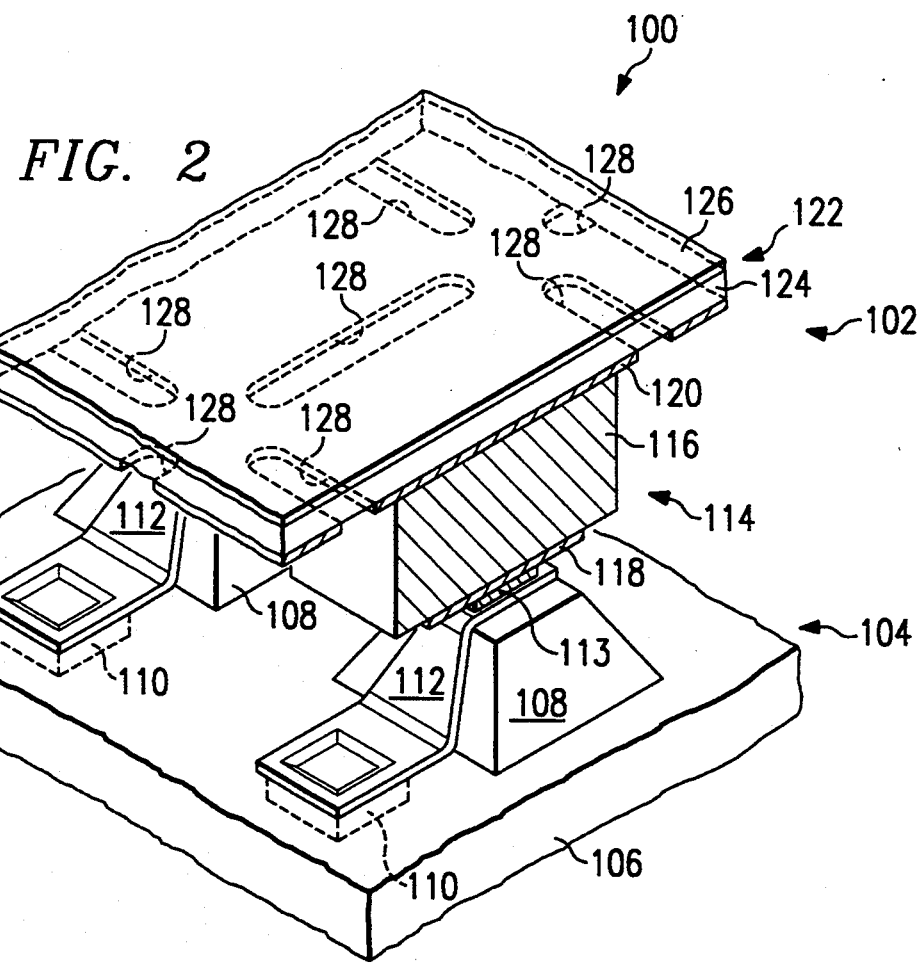
FIG. 2 is an isometric drawing showing a portion of a thermal detection system having an infrared absorber and common electrode assembly with slots, shown in phantom lines, formed in the common electrode intermediate the thermal sensors.
Figure 3:
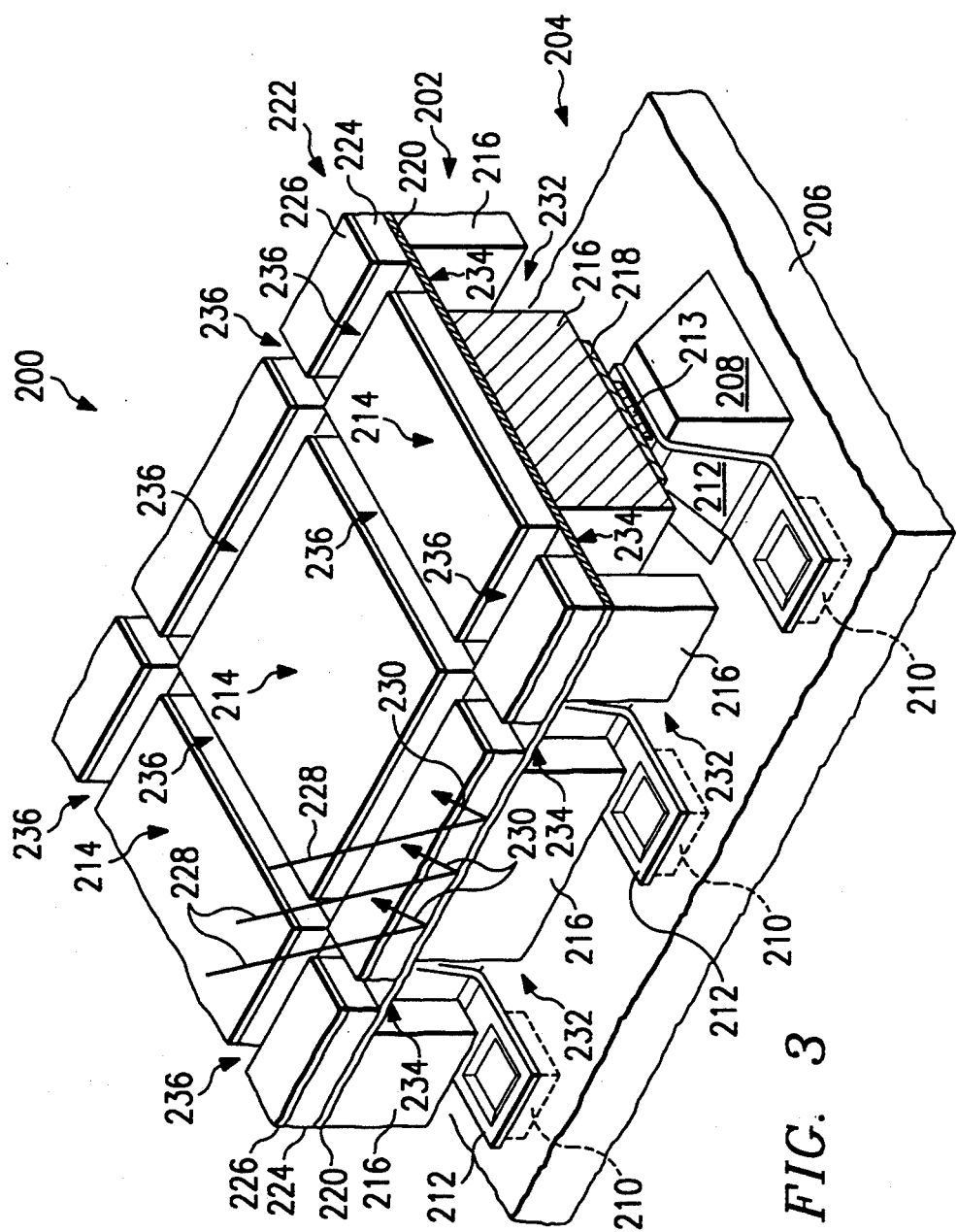
FIG. 3 is an isometric drawing showing a portion of a thermal detection system having an infrared absorber and common electrode assembly with slots in the optical coating formed around the periphery of each thermal sensor.

The present invention and its advantages are best understood by referring to FIGS. 1-3 of the drawings, like numerals being used for like and corresponding parts of the various drawings.

Infrared detectors are typically based upon either the generation of a change in voltage or current due to a change in temperature resulting from incident infrared radiation striking the detector or the generation of a change in voltage or current due to a photon-electron interaction within the material used to form the detector. This latter effect is sometimes called the internal photo-electric effect, and detectors using this phenomenon are called photon detectors. Detectors that make use of temperature dependent properties are called thermal detectors. Some thermal detectors are based upon the change in resistance or capacitance of a thin conductor caused by the heating effect of incident infrared radiation. Such thermal detectors are sometimes referred to as bolometers.

Thermal detection systems 100 and 200, which will be described later in more detail, function based upon the generation of a change in voltage or current due to a change in temperature of a pyroelectric material resulting from incident infrared radiation. However, the present invention may be used with other types of thermal detectors including bolometers.

The performance of thermal detection systems may be improved by thermally isolating each thermal sensor from its surrounding environment. Previous thermal detection systems have attempted to improve sensitivity by thermally isolating the focal plane array from the underlying integrated circuit substrate. One approach provides a thermal isolation structure having thermal isolation mesas extending from the integrated circuit substrate and supporting the focal plane array. This approach attempts to maximize pixel-IC thermal isolation to improve thermal detection. The present invention enhances thermal detection system performance by improving inter-pixel thermal isolation within the focal plane array between adjoining thermal sensors.

A major source of inter-pixel thermal conductivity in previous thermal detection systems was the common electrode and infrared absorber assembly disposed over the plurality of thermal sensors. In particular, previous infrared detectors formed the common electrode from a high electrical conductivity material, such as nichrome, to deliver a potential to the thermal sensors. The same highly electrically conductive materials used to form the common electrode also exhibited high thermal conductivity, which resulted in poor inter-pixel thermal isolation. Previous attempts to solve this problem of inter-pixel thermal isolation focused on depositing a thinner metal common electrode, which increased the occurrences of electrical discontinuities in the focal plane array. The present invention improves inter-pixel thermal isolation in the focal plane array by selectively reticulating the common electrode and/or by forming the common electrode from a thermally insulating material, such as a cermet (e.g., a silicon monoxide and chromium matrix) or other metal oxide.

A measure of thermal detection system performance is the Modulation Transfer Function (MTF), which increases as the ratio of inter-pixel thermal isolation to pixel-IC thermal isolation increases. Therefore, for a given pixel-IC thermal isolation it is advantageous to maximize the inter-pixel thermal isolation. Furthermore, as the pixel-IC thermal isolation is increased to provide improved detector sensitivity, the inter-pixel thermal isolation should be at least proportionately increased to avoid MTF degradation. The inter-pixel thermal isolation on current thermal detection systems depends primarily on the thermal conductivity between adjoining thermal sensors through the infrared absorber and common electrode assembly.

FIG. 1 is a schematic representation that illustrates the inter-pixel thermal conductivity between thermal sensors 12 and 14 in focal plane array 10. Each thermal sensor comprises a pyroelectric element 16 coupled to an associated sensor signal electrode 18. Each pyroelectric element 16 is coupled on the opposite side to infrared absorber and common electrode assembly 20. The thermal conductivity between thermal sensors 12 and 14 through infrared absorber and common electrode assembly is represented by thermal circuit 22.

A thermal current $i_T$ flows through thermal circuit 22 corresponding to the thermal conductivity of infrared absorber and common electrode assembly 20. The thermal current $i_T$ is shown to flow from thermal sensor 12 to thermal sensor 14, but it should be understood that a thermal current is bi-directional depending on the relative temperatures of thermal sensors 12 and 14. Thermal circuit 22 comprises two parallel thermal current paths, corresponding to the two major components of infrared absorber and common electrode assembly 20. A common electrode component $i_e$ flows through the common electrode having thermal resistance 24 and an optical coating component $i_o$ flows through optical coating having a thermal resistance 26. Infrared absorber and common electrode assembly 20 may also include a thin layer disposed over the optical coating, but its overall contribution to thermal conductivity between thermal sensors 12 and 14 is relatively small in comparison to the thermal conductivity of common electrode and optical coating.

To optimize inter-pixel thermal isolation between adjoining thermal sensors 12 and 14, thermal resistances 24 and 26 are preferably maximized to minimize total thermal current $i_T$ through thermal circuit 22. One way to reduce thermal current $i_T$ is to reduce the thickness of the common electrode in infrared absorber and common electrode assembly 20, which consequently increases thermal resistance 24. However, thinning common electrode may result in a loss of mechanical integrity during the fabrication process and an increase in the occurrence of electrical discontinuities between thermal sensors 12 and 14.

Another approach for improving inter-pixel thermal isolation between thermal sensors 12 and 14 is to reticulate selected portions of infrared absorber and common electrode assembly 20 to minimize the thermal current flowing between thermal sensors 12 and 14. One approach provides an infrared absorber and common electrode assembly with a plurality of longitudinal openings extending entirely through the focal plane array intermediate the respective thermal sensors. The longitudinal openings are configured to maintain an electrical path through the common electrode for supplying a potential to each thermal sensor.

Another approach for improving inter-pixel thermal isolation between thermal sensors 12 and 14 is to choose alternative materials to form the component layers of infrared absorber and common electrode assembly 20. In current thermal detection systems, where the common electrode is formed from nichrome (NiCr) and the optical coating is formed from parylene, optical coating thermal resistance 26 is herein recognized to be three to ten times greater than common electrode thermal resistance 24. Therefore, it is desirable to choose a thermally insulating material to form common electrode, which is the primary source of thermal coupling between adjoining thermal sensors 12 and 14.

The present invention can use a thermally insulating material, such as a silicon monoxide and chromium matrix (cermet), to form the common electrode. Other thermally insulating materials may also be used, such as other metal oxides. A common electrode formed from a thermally insulating material provides adequate electrical conductivity for delivering a potential to each thermal sensor, while considerably improving inter-pixel thermal isolation. Furthermore, a common electrode layer formed from thermally insulating material may be thicker to provide greater mechanical integrity during the fabrication process without sacrificing thermal isolation.

A silicon monoxide and chromium matrix is only one example of the composite materials or cermets which may be satisfactorily used to fabricate focal plane array 10 in accordance with the present invention. Other mixtures of metal and ceramic materials may be selected to form a cermet having the desired characteristics of high thermal resistance, adequate electrical conductivity, and good mechanical strength for use in fabricating a specific focal plane array. The present invention allows optimization of these characteristics to meet the operating requirements of the resulting thermal detection system.

One embodiment of the present invention is shown in connection with infrared detector or thermal detection system 100 of FIG. 2. Some of the principal components which comprise thermal detection system 100 include focal plane array 102, thermal isolation structure 104, and integrated circuit substrate 106. Thermal isolation structure 104 provides pixel-IC thermal isolation, electrical coupling between focal plane array 102 and integrated circuit substrate 106, and structural support for mounting focal plane array 102 on integrated circuit substrate 106.

Thermal isolation structure 104 comprises mesa-type formations 108 formed adjacent to contact pads 110 of integrated circuit substrate 106. Mesa-type formations 108 are formed from polyimide or other thermally insulating material. Each mesa-type formation 108 supports a corresponding mesa strip conductor 112, which electrically couples focal plane array 102 to a corresponding contact pad 110 disposed on integrated circuit substrate 106. Bump-bonding material 113 may be placed on mesa strip conductor 112 to facilitate bonding of thermal isolation structure 104 to focal plane array 102. It should be understood that the present invention can include any thermal isolation structure 104 that provides pixel-IC thermal isolation, mechanical integrity during the fabrication process, and adequate electrical coupling between integrated circuit substrate 106 and focal plane array 102.

Various types of semiconductor materials and integrated circuit substrates may be used with the present invention. U.S. Pat. No. 4,143,629, entitled "Ferroelectric Imaging System," issued to McCormack, et al. and assigned to Texas Instruments Incorporated, provides information concerning infrared detectors fabricated from pyroelectric elements and a silicon switching matrix or integrated circuit substrate. It should be understood that the present invention may be used with any appropriate integrated circuit substrate 106. U.S. Pat. No. 5,047,644, entitled "Polyimide Thermal Isolation Mesa for a Thermal Imaging System," issued to Meissner, et al. and assigned to Texas Instruments Incorporated, discloses a thermal isolation structure having thermal isolation mesa-type formations formed from polyimide.

Focal plane array 102 comprises a plurality of thermal sensors 114. The quantity and configuration of thermal sensors 114 depends on the desired N by M pixel resolution of focal plane array 102. Thermal sensor 114 comprises pyroelectric element 116 formed from a material that changes its electrical polarization and capacitance in response to thermal radiation. For one application barium strontium titanate (BST) may be used to form pyroelectric element 116. Also, materials in the lead titanate family including lead titanate (PT), lead lanthanum titanate (PLT), lead zirconium titanate (PZT), and lead lanthanum zirconium titanate (PZLT)

may be used to form pyroelectric element 116 for use with thermal detection systems incorporating the present invention.

The pyroelectric transducer or capacitor associated with each thermal sensor 114 is defined in part by pyroelectric element 116, sensor signal electrode 118, and common electrode 120 of infrared absorber and common electrode assembly 122. Therefore, pyroelectric element 116 functions as a dielectric with respect to sensor signal electrode 118 and common electrode 120. Infrared absorber and common electrode assembly 122 also includes optical coating 124 and optionally thin outer layer 126.

In one embodiment, infrared absorber and common electrode assembly 122 is a multi-layer structure that forms a resonant optical cavity tuned to maximize absorption over the eight to twelve micron wavelength of the infrared spectrum. Common electrode 120 may be formed from an opaque, highly reflective material such as nichrome (NiCr) or, as discussed below, from a thermally insulating material such as cermet. Optical coating 124 is an organic material, such as parylene, whose thickness is adjusted as appropriate for its refractive index to tune the cavity to maximize absorption over the desired spectrum. Thin outer layer 126 is a thin, semi-transparent metal whose thickness is adjusted to minimize the net amplitude of the electromagnetic wave reflected from the resonant cavity. In operation, thermal detection system 100 produces a thermal image in response to incident infrared radiation striking focal plane array 102. Infrared absorber and common electrode assembly 122 absorbs infrared energy and transfers a temperature change to pyroelectric element 116 of thermal sensor 114. The temperature change alters the electrical polarization and capacitance of pyroelectric element 116 and produces a representative sensor signal appearing on sensor signal electrode 118. The total sensor signal output will depend upon the electrical polarization and capacitance of pyroelectric element 116, which in turn is a function of the incident infrared radiation.

The sensor signal output from each thermal sensor 114 in focal plane array 102 is individually coupled to integrated circuit substrate 106 through mesa strip conductor 112 of thermal isolation structure 104. Sensor signal electrode 118 is electrically coupled through mesa strip conductor 112 of thermal isolation structure 104 to a corresponding contact pad 110 on integrated circuit substrate 106.

Common electrode 120 provides a potential to each thermal sensor 114 of focal plane array 102. It should be understood from the present invention that potential can include a positive, negative, or ground potential. Common electrode 120 and optical coating 124, as shown in FIG. 2, extend over all thermal sensors 114 of focal plane array 102. Therefore, undesirable thermal coupling between adjoining thermal sensors 114 is possible due to the thermal conductivity of common electrode 120 and optical coating 124. If common electrode 120 is formed of nichrome and optical coating 124 is formed from parylene, common electrode 120 is the major contributor of undesirable inter-pixel thermal coupling.

Therefore, to maximize inter-pixel thermal isolation, slots 128 (shown in phantom lines) are formed in common electrode 120. Slots 128 are placed intermediate thermal sensors 114 and are configured to maintain an electrical path through common electrode 120 for supplying a potential to thermal sensors 114. The configuration of slots 128 shown in FIG. 2 allow adjacent thermal sensors to be electrically coupled through common electrode 120 at their corners. It should be understood that the present invention can include any configuration of slots 128 to achieve enhanced inter-pixel thermal isolation while providing adequate electrical coupling to deliver a potential to each thermal sensor 114.

In one embodiment, slots 128 are formed in common electrode 120 and do not extend through optical coating 124. In this case, focal plane array 102 comprises a reticulated common electrode 120 and a non-reticulated, continuous optical coating 124. This construction of infrared absorber and common electrode assembly 122 provides improved inter-pixel thermal isolation.

Inter-pixel thermal isolation may be improved further by forming common electrode 120 from a thermally insulating material, such as a selected cermet. This embodiment of the present invention is shown in connection with infrared detector or thermal detection system 200 of FIG. 3. Thermal detection system 200 improves inter-pixel thermal isolation by forming the common electrode out of cermet, an oxidized metal, or other lower thermal conductivity material.

Thermal detection system 200 comprises focal plane array 202, thermal isolation structure 204, and integrated circuit substrate 206. Both thermal isolation structure 204 and integrated circuit substrate 206 remain unchanged from thermal detection system 100 of FIG. 2.

Thermal isolation structure 204 comprises mesa-type formations 208 formed adjacent to contact pads 210 of integrated circuit substrate 206. Each mesa-type formation 208 supports mesa strip conductor 212, which electrically couples focal plane array 202 to a corresponding contact pad 210 disposed on integrated circuit substrate 206. Bump-bonding material 213 may be placed on mesa strip conductor 212 to facilitate bonding of thermal isolation structure 204 to focal plane array 202. It should be understood that the present invention can include any thermal isolation structure 204 that provides pixel-IC thermal isolation, mechanical integrity during the fabrication process, and adequate electrical coupling between integrated circuit substrate 206 and focal plane array 202.

Focal plane array 202 comprises a plurality of thermal sensors 214. Thermal sensor 214 is formed from a pyroelectric element 216, such as barium strontium titanate (BST) or other appropriate materials discussed above with reference to FIG. 2. The pyroelectric transducer or capacitor associated with each thermal sensor 214 is defined in part by pyroelectric element 216, sensor signal electrode 218, and common electrode 220 of infrared absorber and common electrode assembly 222.

Infrared absorber and common electrode assembly 222 also includes optical coating 224 and optionally thin outer layer 226. Optical coating 224 is formed from parylene, or other suitable organic material capable of absorbing energy over the desired spectrum of thermal detection system 200. Thin outer layer 226 is formed from a thin semi-transparent metal that reduces the net amplitude of the electromagnetic wave reflected from the resonant cavity of infrared absorber and common electrode assembly 222.

An important feature of the present invention includes forming common electrode 220 from thermally insulating material which provides a high degree of inter-pixel thermal isolation between adjoining thermal sensors 214 in focal plane array 202. Common electrode 220 may be formed from cermets, such as silicone monoxide and chromium, characterized by thermally insulating, high mechanical strength, and adequate electrical conductivity. The composition and percentages of metal and ceramics in the selected cermet may be varied to provide the optimum performance of the resulting thermal detection system 200. For some applications, ceramic material having a relatively high degree of electrical resistivity may be used to form common electrode 220.

For one application of the present invention, common electrode 220 may be formed from cermet having approximately eighty percent chromium and twenty percent silicon monoxide. Depending upon the specific application, common electrode 220 may be formed from cermets having a metal concentration by weight of approximately seventy percent to ninety percent and a corresponding ceramic concentration by weight of approximately thirty percent to ten percent. In addition to various cermets, common electrode 220 may be formed from tantalum nitride, tantalum oxide and/or titanium oxide nitride. The present invention allows using a wide variety of thermally insulating materials to form common electrode 220.

For one application, the cermet used to form common electrode 220 will preferably have an electrical resistivity of 2,500 microhms-centimeter and a thermal conductivity of $1.1 \times 10^{-2}$ watts/centimeter/° C. A matrix of silicon monoxide and chromium is representative of the types of cermet which can provide these desired characteristics.

Depending upon the type of thermally insulating material selected, common electrode 220 may be formed using reactive sputtering techniques or composite target sputtering. For one application of the present invention, sputtering with silicone and chromium in an oxygen environment may be used to form common electrode 220 with the desired characteristics. Composite target sputtering allows compositional control to achieve the desired stoichiometry of the resulting common electrode 220.

The design choice for the thermally insulating material used to form common electrode 220 should consider its three primary purposes. First, common electrode 220 supplies a potential to thermal sensors 214 of focal plane array 202. Second, common electrode 220 should possess the proper opacity and high reflectivity to maximize absorption of infrared energy. Current thermal detection systems tune optical coating 224 to produce a resonant cavity of approximately one quarter the wavelength of incoming electromagnetic radiation 228, as depicted by the three longer parallel lines in FIG. 3. Common electrode 220 preferably reflects all incoming radiation 228 through optical coating 224 to allow cancellation of incoming radiation 228 and reflected radiation 230 to maximize infrared energy absorption.

The third purpose served by common electrode 220 is as an etch stop during fabrication of focal plane array 202. During processing, channels 232 between pyroelectric elements 216 of thermal sensors 214 are filled with an organic material that should be removed prior to hybridization of focal plane array 202 to integrated circuit substrate 206. Organic material in channels 232 is removed with an anisotropic etch that uses common electrode 220 as an etch stop 234. Common electrode 220 may undergo plasma bombardment during the anisotropic etch, which may sacrifice mechanical integrity or increase the occurrences of electrical discontinuities due to over etching. Therefore, common electrode 220 is preferably formed from a material that performs adequately as a reflector, an electrical conductor, and an etch stop, while minimizing thermal conductance between adjacent thermal sensors 214.

Current thermal detection systems form common electrode 220 out of a reflective metal, such as nichrome. To maximize inter-pixel thermal isolation, this metal layer is made extremely thin, which increases the occurrence of electrical discontinuities during fabrication, leading to inoperative pixels. Furthermore, a thin layer of nichrome may adequately perform the functions of a reflector and electrical conductor, but its function as a reliable etch stop is severely impaired by reducing overall metal thickness.

Forming common electrode 220 out of cermet, an oxidized metal, or other thermally insulating material permits use of a thicker layer to maintain mechanical integrity, while providing an overall lower thermal conductance. Common electrode 220 formed from thermally insulating material provides adequate reflectivity and electrical conductivity properties, and provides a more resilient structure to be used as an etch stop during fabrication.

In thermal detection system 200 with common electrode 220 formed from thermally insulating material, such as cermet, and optical coating 224 formed from parylene, optical coating 224 may account for seventy percent or more of the thermal crosstalk between adjacent thermal sensors 214. Therefore, in one embodiment where neither the common electrode 220 nor the optical coating 224 is reticulated, the overall crosstalk between adjacent thermal sensors 214 is reduced as a result of the reduced thermal conductance of common electrode 220.

In another embodiment, slots 236 may be formed in optical coating 224. Slots 236 may be formed around the entire periphery of thermal sensors 214, as shown in FIG. 3, or intermediate thermal sensors 214. Slots 236 preferably extend through thin outer layer 226. The width of slots 236 formed in optical coating 224 should be minimized to allow optical coating 224 to absorb maximum thermal energy, while still blocking thermal energy transfer between adjacent cubes or blocks of parylene.

In yet another embodiment, slots as described with reference to common electrode 120 of FIG. 2 may also be formed in common electrode 220. One particular example of an infrared absorber and common electrode assembly 222 constructed in accordance with the present invention may have slots formed in common electrode 220 intermediate thermal sensors 214 and slots formed in optical coating 224 and thin outer layer 226 around the entire periphery of thermal sensors 214. It should be understood that the present invention contemplates any arrangement and number of slots formed in optical coating 224, thin outer layer 226, and common electrode 220 to enhance inter-pixel thermal isolation while still providing a common potential to thermal sensors 214.

Layers 120 and 220 of focal plane arrays 102 and 202, respectively, have been described as a "common electrode." For some thermal sensors, a potential may not be required or may be supplied by another electrode (not shown). For such thermal sensors, layers 120 and 220 may be formed from cermet or other thermally insulating material as previously described. The present invention is not limited to use with focal plane arrays which have a "common electrode."

Although the present invention has been described with several embodiments, various changes and modifications may be suggested to one skilled in the art, and it is intended that the present invention encompass such changes and modifications as fall within the scope of the appended claims.

What is claimed is:

1. A hybrid thermal detector including a focal plane array mounted with a thermal isolation structure on an integrated circuit substrate, comprising:
   at least three thermal sensors in the focal plane array for providing a sensor signal output representative of thermal radiation incident to the focal plane array;
   a common electrode coupled to the thermal sensors, the common electrode having at least three slots formed intermediate the thermal sensors, the slots configured so that the common electrode supplies a potential to the thermal sensors;
   a non-reticulated, continuous optical coating sensitive to infrared radiation disposed over the common electrode;
   the thermal isolation structure disposed between the focal plane array and the integrated circuit substrate, the thermal isolation structure projecting from the integrated circuit substrate for mounting the focal plane array and for coupling the focal plane array to the integrated circuit substrate; and
   at least three contact pads, disposed on the integrated circuit substrate, for receiving the sensor signal output from the thermal sensors through the thermal isolation structure.

2. The detector of claim 1, wherein:
   each thermal sensor is associated with a pyroelectric element formed from barium strontium titanate; and
   the common electrode is coupled to one side of the pyroelectric element and a sensor signal electrode is coupled to the opposite side of the pyroelectric element.

3. The detector of claim 1, wherein the common electrode is formed from cermet having a metal concentration by weight of seventy percent to ninety percent and a corresponding ceramic concentration by weight of thirty percent to ten percent.

4. A hybrid thermal detector including a focal plane array mounted with a thermal isolation structure on an integrated circuit substrate, comprising:
   at least three thermal sensors in the focal plane array for providing a sensor signal output representative of thermal radiation incident to the focal plane array;
   a common electrode formed from cermet disposed over the thermal sensors for supplying a potential to the thermal sensors;
   an optical coating sensitive to infrared radiation disposed over the common electrode;
   the thermal isolation structure disposed between the focal plane array and the integrated circuit substrate, the thermal isolation structure projecting from the integrated circuit substrate for mounting the focal plane array and for coupling the thermal sensors to the integrated circuit substrate; and
   at least three contact pads, disposed on the integrated circuit substrate, for receiving the sensor signal output from the thermal sensors through the thermal isolation structure.

5. The detector of claim 4, wherein the common electrode is formed from cermet having a thermal conductivity of less than $2 \times 10^{-2}$ watts/centimeter/° C.

6. The detector of claim 4, wherein the optical coating has at least three slots formed therein, the slots disposed intermediate the thermal sensors to improve inter-pixel thermal isolation.

7. The detector of claim 4, wherein the optical coating has at least three slots formed therein, the slots disposed entirely around the periphery of the thermal sensors to improve inter-pixel thermal isolation.

8. The detector of claim 4, wherein:
   the optical coating has at least three first slots formed therein, the first slots disposed entirely around the periphery of the thermal sensors to improve inter-pixel thermal isolation; and
   the common electrode has at least three second slots formed therein, the second slots disposed intermediate the thermal sensors to improve inter-pixel thermal isolation, the second slots configured so that the common electrode supplies a potential to the thermal sensors.

9. The detector of claim 4, wherein the optical coating is formed from parylene.

10. The detector of claim 4, wherein:
    each thermal sensor is associated with a pyroelectric element formed from barium strontium titanate; and
    the common electrode is coupled to one side of the pyroelectric element and a sensor signal electrode is coupled to the opposite side of the pyroelectric element.

11. The detector of claim 4, wherein:
    each thermal sensor is associated with a pyroelectric element formed from barium strontium titanate;
    the common electrode is coupled to one side of the pyroelectric element and a sensor signal electrode is coupled to the opposite side of the pyroelectric element; and
    the common electrode forms at least three channels around the entire periphery of the pyroelectric element.

12. A method of fabricating a hybrid thermal detection system having a focal plane array mounted with a thermal isolation structure on an integrated circuit substrate, comprising the steps of:
    forming the focal plane array from at least three thermal sensors that provide a sensor signal output representative of thermal radiation incident to the focal plane array;
    coupling a first side of the thermal sensors to a common electrode, the common electrode having at least three slots formed intermediate the thermal sensors, the slots configured so that the common electrode supplies a potential to the thermal sensors;
    forming a non-reticulated, continuous optical coating sensitive to infrared radiation disposed over the common electrode;
    providing the integrated circuit substrate with at least three contact pads for receiving the sensor signal output from the thermal sensors;
    forming the thermal isolation structure disposed between the focal plane array and the integrated circuit substrate, the thermal isolation structure formed in part from at least three mesa-type formations projecting from the integrated circuit substrate adjacent to the contact pads; and coupling a second side of the thermal sensors to the thermal isolation structure to establish a sensor signal flowpath from the thermal sensors to the integrated circuit substrate.

13. The method of fabricating the system as defined in claim 12, wherein the common electrode is formed from cermet having a thermal conductivity of less than $2\times10^{-2}$ watts/centimeter/° C.

14. The method of fabricating the system as defined in claim 12, further comprising the steps of:

coupling one side of a pyroelectric element associated with each thermal sensor to the common electrode for receiving a potential; and coupling the opposite side of the pyroelectric element to an associated contact pad disposed on the integrated circuit substrate.

15. A method of fabricating a hybrid thermal detection system having a focal plane array mounted with a thermal isolation structure on an integrated circuit substrate, comprising the steps of:

forming the focal plane array from at least three thermal sensors that provide a sensor signal output representative of thermal radiation incident to the focal plane array;

coupling a first side of the thermal sensors to a common electrode formed from thermally insulating material so that the common electrode provides a potential to the thermal sensors;

forming an optical coating sensitive to infrared radiation disposed over the common electrode;

providing the integrated circuit substrate with at least three contact pads for receiving the sensor signal output from the thermal sensors;

forming the thermal isolation structure disposed between the focal plane array and the integrated circuit substrate, the thermal isolation structure formed in part from at least three mesa-type formations projecting from the integrated circuit substrate adjacent to the contact pads; and coupling a second side of the thermal sensors to the thermal isolation structure to establish a sensor signal flowpath from the thermal sensors to the integrated circuit substrate.

16. The method of fabricating the system as defined in claim 15, further comprising the step of forming at least three slots in the optical coating around the periphery of the thermal sensors to improve inter-pixel thermal isolation.

17. The method of fabricating the system as defined in claim 15, further comprising the steps of:

forming at least three first slots in the optical coating around the periphery of the thermal sensors to improve inter-pixel thermal isolation; and forming at least three second slots in the common electrode intermediate the thermal sensors to improve inter-pixel thermal isolation, the second slots configured so that the common electrode supplies the potential to the thermal sensors.

18. The method of fabricating the system as defined in claim 15, further comprising the steps of:

coupling one side of a pyroelectric element associated with each thermal sensor to the common electrode for receiving a potential; and coupling the opposite side of the pyroelectric element to an associated contact pad disposed on the integrated circuit substrate.

19. The method of fabricating the system as defined in claim 15, wherein the common electrode is formed from cermet.

20. The method of fabricating the system as defined in claim 15, wherein the optical coating is formed from parylene.

21. A hybrid thermal detector including a focal plane array mounted with a thermal isolation structure on an integrated circuit substrate, comprising:

at least three thermal sensors in the focal plane array for providing a sensor signal output representative of thermal radiation incident to the focal plane array;

a common electrode formed from thermally insulating material disposed over the thermal sensors for supplying a potential to the thermal sensors;

an optical coating sensitive to infrared radiation disposed over the common electrode;

the thermal isolation structure disposed between the focal plane array and the integrated circuit substrate, the thermal isolation structure projecting from the integrated circuit substrate for mounting the focal plane array and for coupling the thermal sensors to the integrated circuit substrate; and at least three contact pads, disposed on the integrated circuit substrate, for receiving the sensor signal output from the thermal sensors through the thermal isolation structure.

22. The detector of claim 21, wherein the common electrode is formed from cermet.

23. The detector of claim 21, wherein the common electrode is formed from a metal oxide.

24. The detector of claim 21, wherein the common electrode is formed from a thermally insulating material having a thermal conductivity of less than $2\times10^{-2}$ watts/centimeter/° C.

25. The detector of claim 21, wherein the common electrode is formed from a thermally insulating material chosen from the group consisting of tantalum nitride, tantalum oxide, and titanium oxide nitride.

26. The detector of claim 21, wherein the optical coating has at least three slots formed therein, the slots disposed intermediate the thermal sensors to improve inter-pixel thermal isolation.

27. The detector of claim 21, wherein the optical coating has at least three slots formed therein, the slots disposed entirely around the periphery of the thermal sensors to improve inter-pixel thermal isolation.

28. The detector of claim 21, wherein the common electrode has at least three slots formed therein, the slots disposed intermediate the thermal sensors to improve inter-pixel thermal isolation, the slots configured so that the common electrode supplies a potential to the thermal sensors.

29. The detector of claim 21, wherein:

the optical coating has at least three first slots formed therein, the first slots disposed entirely around the periphery of the thermal sensors to improve inter-pixel thermal isolation; and the common electrode has at least three second slots formed therein, the second slots disposed intermediate the thermal sensors to improve inter-pixel thermal isolation, the second slots configured so that the common electrode supplies a potential to the thermal sensors.

30. The detector of claim 21, wherein:

each thermal sensor is associated with a pyroelectric element formed from barium strontium titanate; and the common electrode is coupled to one side of the pyroelectric element and a sensor signal electrode is coupled to the opposite side of the pyroelectric element.

* * * * *